United States Patent [19]

Nowotarski

[11] Patent Number: 5,071,058

[45] Date of Patent: Dec. 10, 1991

[54] PROCESS FOR JOINING/COATING USING AN ATMOSPHERE HAVING A CONTROLLED OXIDATION CAPABILITY

[75] Inventor: Mark S. Nowotarski, Ossining, N.Y.

[73] Assignee: Union Carbide Industrial Gases Technology Corporation, Danbury, Conn.

[21] Appl. No.: 419,325

[22] Filed: Oct. 10, 1989

Related U.S. Application Data

[63] Continuation of Ser. No. 251,259, Sep. 30, 1988, abandoned.

[51] Int. Cl.$^5$ .................. B23K 35/38; H05K 3/34
[52] U.S. Cl. .................. 228/219; 228/223; 228/42; 427/432
[58] Field of Search ............ 228/119, 218, 179, 180.1, 228/180.2, 37, 42, 223, 219, 221; 427/432

[56] References Cited

U.S. PATENT DOCUMENTS

| | | | |
|---|---|---|---|
| 3,882,596 | 5/1975 | Kendziora et al. | 228/220 |
| 3,900,151 | 8/1975 | Schoer et al. | 228/220 |
| 4,121,750 | 10/1978 | Schoer et al. | 228/219 |
| 4,369,211 | 1/1983 | Nitto et al. | 228/219 |
| 4,444,814 | 4/1984 | Flinchum et al. | 228/219 |
| 4,538,757 | 9/1985 | Bertiger | 228/180.1 |
| 4,606,493 | 8/1986 | Christoph et al. | 228/180.1 |
| 4,610,391 | 9/1986 | Nowotarski | 228/219 |

FOREIGN PATENT DOCUMENTS

| | | | |
|---|---|---|---|
| 95854 | 8/1978 | Japan | 228/219 |
| 1250610 | 10/1971 | United Kingdom | 228/219 |
| 2171042 | 7/1987 | United Kingdom . | |

OTHER PUBLICATIONS

Brunner et al., "Joining Chip to Substrate in Oxygen-Containing Atmosphere", IBM Technical Disclosure Bulletin, vol. 20, No. 6, Nov. 1977, p. 2318.
Totta, "Flip Chip Solder Terminals", Proceedings of the 21st Electronic Components Conference, IEEE, May 1971, pp. 275-284.

Primary Examiner—Samuel M. Heinrich
Attorney, Agent, or Firm—Alvin H. Fritschler; Peter Kent

[57] ABSTRACT

This invention relates to a method of conducting a joining/coating operation which provides good wetting of metal-comprising substrate surfaces by metal-comprising filler/coating materials while reducing the rate of metal oxide formation. The joining/coating operation is carried out in a controlled oxidizing atmosphere having an oxidation capability greater than that required to oxidize a metal-comprising filler material used for joining or a metal-comprising coating, but having less oxidation capability than that of air. Typically the controlled oxidizing atmosphere consists essentially of nitrogen and oxygen, wherein the oxygen concentration is controlled at a set point. The range of the setpoint corresponds with an oxygen concentration which can range from greater than about 10 ppm to about 100,000 ppm, depending on the application. When a flux is used and the joining technique is reflow soldering, the setpoint for oxygen concentration can range from greater than about 100 ppm to less than about 50,000 ppm of oxygen, depending on the application, with a preferred range from about 500 ppm to about 10,000 ppm. When a flux is used and the joining technique is wave soldering, the setpoint for oxygen concentration can range from about 1,000 ppm to about 100,000 ppm of oxygen depending on the application, with a preferred range from about 10,000 ppm to about 20,000 ppm. Joining/coating operations conducted without use of a flux require a joining/coating atmosphere having a lower oxidation capability, but still capable of oxidizing the metal-comprising filler material/metal-comprising coating material.

27 Claims, 1 Drawing Sheet

PROCESS FOR JOINING/COATING USING AN ATMOSPHERE HAVING A CONTROLLED OXIDATION CAPABILITY

This application is a continuation of application Ser. No. 07/251,259, filed Sept. 30, 1988, and now abandoned.

FIELD OF THE INVENTION

This invention relates to a method of joining/coating wherein the oxygen concentration of the atmosphere surrounding the joining/coating operation is controlled to provide improved wetting between a metal comprising filler used for joining or a metal-comprising coating material and a metal comprising substrate to which the metal comprising filler/coating material is to be applied. The method can be optimized to provide improved wetting of the substrate while simultaneously reducing metal oxide generation rates.

BACKGROUND ART

In recent years, numerous methods have been developed to provide for improved joining of or coating of metal comprising substrates. The joining or coating is typically conducted in the presence of a fluxing agent which is used to react with or dissolve and wash away compounds which are detrimental to wetting of the substrate surfaces which are to be joined or coated. However, fluxing agents are typically corrosive and residues must be removed from workpieces after the joining or coating operation. In addition, should the amount of flux be insufficient, the metal comprising filler used for joining or the metal comprising coating material can form icicles on the part as the part is removed from the joining/coating bath; wetting time may be inadequate within the process so that poor bonding between metal comprising filler/coating material and metal-comprising substrate occurs; and metal oxide formation (dross) production during the joining/coating operation may be rapid, leading to heavy maintenance requirements.

Attempts have been made to solder or coat metallic substrates without a flux. If a substrate surface which can be wetted by the solder/coating is provided and the solder/coating operation is carried out in an inert atmosphere, such as an oxygen free atmosphere, it is possible to solder/coat the metallic substrate without a flux. However, fluxless soldering in an inert atmosphere does not always provide adequate wetting of the metallic substrate. The viscosity and surface tension of the metal-comprising filler material causes such material to form droplets and pull away from the metallic substrate which must be well contacted by the metal comprising filler material to obtain a good bond between such material and the substrate. The pulling away of the metal-comprising filler material from the substrate is frequently referred to as dewetting. The wetting ability of the metal comprising filler material has been increased by adding wetting agents such as bismuth, strontium, barium, beryllium, and antimony to the metal-comprising filler material. However, these wetting agents are expensive, sometimes generate toxic fumes, and can form undesirable compounds, such as brittle inter-metallics, within the solder (which weaken the solder).

Typical of the known art in this area are the following U.S. Pat. Nos.

U.S. Pat. No. 3,882,596, to Kendziora et al., dated May 13, 1975, discloses a method for flux free soldering of aluminum containing workpieces in a controlled atmosphere. The controlled atmosphere is free of contaminants such as ceramic materials, asbestos, grease, oil, rubber or plastic materials and is preferably of low oxygen content. Liquid purified nitrogen which has been vaporized is recommended as the controlled atmosphere.

U.S. Pat. No. 3,900,151, to Schoer et al., dated Aug. 19, 1975, discloses a method for flux free soldering of aluminum-containing workpieces in a non-oxidizing atmosphere or a low-oxygen content atmosphere, wherein aluminum and beryllium wetting agents are added to the solder. The solder is a zinc based solder.

U.S. Pat. No. 4,121,750 to Schoer et al., dated Oct. 24, 1978, discloses processes and compositions for soldering aluminum containing workpieces. The soldering is carried out in a substantially- non-oxidizing atmosphere. The solder may be used with or without flux, and a filler material comprising an aluminum containing from 6 to 20% by weight of silicon and from 0.01 to 10% by weight of an aluminum wetting agent selected from the group consisting of bismuth, antimony, strontium and barium is interposed between the workpieces to be joined.

U.S. Pat. No. 4,538,757 to Bertiger, dated Sept. 3, 1985 describes a method of wave soldering in an enclosure which is substantially free of oxygen. A gaseous reducing agent such as hydrogen is added to the oxygen-free atmosphere in the enclosure to provide a fluxing action during the soldering operation.

U.S. Pat. No. 4,606,493 to Christoph et al., dated Aug. 19, 1986, discloses a method of preventing oxidation of printed circuit board metal surfaces while reducing thermal stress of the board and components during soldering. Soldering is carried out in a reaction chamber which is pressurized with inert gas which seals the reaction chamber from ambient air.

In addition, U.K. Patent No. GB 2171042, to Kamijo et al., dated July 1, 1987, discloses an apparatus for wire bonding semiconductor chip connections. The apparatus uses an electric discharge to melt a fine metal wire into a ball shape; the ball of metal is subsequently pressed into the connections area, wherein the metal flows under pressure to form a bond. It is desired to have the metal which is pressed into the connections area be substantially free of oxides and impurities. This is accomplished using one of two methods: 1) When a fine wire of pure silver is used, the oxygen content of the atmosphere surrounding the electric discharge area in which the metal ball is formed is maintained at no more than 100 ppm. or, 2) When the metal wire is not a pure metal but has selected metal impurities added to it to increase the wire tensile strength, the oxygen content of the atmosphere surrounding the electric discharge area is maintained at 100 ppm to 300 ppm. In this second method, the metal impurities are deposited as oxides on the surface of the molten metal ball, so that when the ball is pressed into the connections area, the pure metal inside the ball forms a better bond in the contacting area.

The U.S. Patents listed above which relate to soldering either state directly or infer that the oxygen content of the soldering atmosphere should be free of oxygen entirely or that the oxygen concentration should be reduced to the minimum practical. In addition, several of the methods described require presence of a reducing soldering atmosphere, or the addition of wetting compounds to the solder/coating material.

It would be an advantage to have a joining/coating method which provides improved wetting between the metal comprising filler/coating material and the metal-comprising substrate, reduces the production rate of undesirable metal oxides, and does not require the addition of a wetting agent to the metal comprising filler/coating material.

SUMMARY OF THE INVENTION

The method of the present invention comprises conducting joining/coating operations in an oxidizing atmosphere having a controlled oxidation capability. The composition of the oxidizing atmosphere is controlled so the oxidation capability of the atmosphere is less than that of air, but greater than that which will reduce metal oxides. Typically the atmosphere is oxygen-comprising and the oxygen content is controlled at or about a set point. The set point depends on the process and can correspond with an oxygen concentration range from about 10 parts per million (ppm) to about 100,000 ppm (10% by volume).

In an atmosphere consisting essentially of an inert gas and oxygen, the preferred oxygen content for reflow soldering of electronic circuity boards, in the presence of a flux, ranges from greater than about 100 ppm to less than about 50,000 ppm (5% by volume); over this oxygen concentration range, there is good wetting of the circuit board metal-comprising substrate surface by the solder and white haze formation is avoided. White haze is a residue commonly remaining on circuit boards after cleaning. It is a tin-flux compound which forms in the presence of high oxygen concentrations, such as that of air.

Examples of inert gases which can be used in the present invention include nitrogen, argon, hydrogen, helium, water vapor, carbon dioxide, and mixtures thereof. One of the most preferred inert gases for use in the present invention is nitrogen due to low cost and non-toxicity. The most preferred atmosphere oxygen content for reflow soldering ranges from greater than about 500 ppm to about 10,000 ppm; over this oxygen concentration range, there is good wetting of the substrate, white haze formation is avoided and the circuit boards (which are typically epoxy glass laminates) do not show discoloration of the kind which occurs at oxygen concentrations of 50,000 ppm or more. The optimum oxygen concentration for reflow soldering can vary for different board designs and flux types; however, minimal experimentation over the greater than 100 ppm to less than 50,000 ppm oxygen concentration range will provide an optimum oxygen concentration for a particular application.

In an atmosphere which consists essentially of nitrogen and oxygen, the preferred oxygen content for wave soldering of electronic circuit boards, in the presence of a flux, ranges from about 1,000 ppm to about 100,000 ppm; over this oxygen concentration range, the amount of metal oxide (dross) formation at the soldering wave is reduced without a significant increase in the amount of bridging (unintended joining of adjacent component leads by solder). The most preferred atmosphere oxygen concentration range for the wave soldering is typically from about 10,000 to about 20,000 ppm; Over this oxygen concentration range dross formation is reduced to about 50% of the dross formation rate in air without any increase in the amount of bridging. The optimum oxygen concentration for wave soldering will vary for different board designs and flux types; however, minimal experimentation over the 1,000 to 100,000 ppm oxygen concentration range will provide an optimum oxygen concentration for a particular application.

When joining/coating is conducted in the absence of a flux, the desired oxygen concentration (in an atmosphere consisting substantially of nitrogen and oxygen) will decrease and the allowed variability will be less.

BRIEF DESCRIPTION OF THE DRAWINGS

FIG. 1A shows a substrate such as copper which has been electroplated with solder.

FIG. 1B shows the structure obtained when an electroplated substrate of the type shown in FIG. 1A is reflowed or when the substrate is dipped in solder and the atmosphere surrounding the soldering operation comprises oxygen at a concentration of greater than 100 ppm.

FIG. 1C shows the reflow or solder dip structure obtained when the atmosphere surrounding the soldering operation comprises oxygen at a concentration of 100 ppm or less.

DETAILED DESCRIPTION OF THE PREFERRED EMBODIMENTS

Figure 1A:
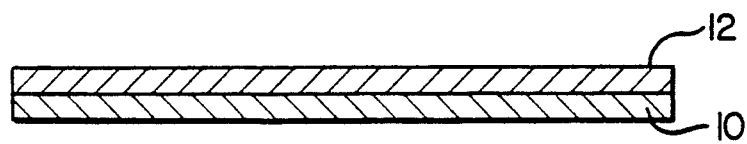
FIGS. 1A-1C show schematics of the dewetting of substrate surface which can occur during reflow soldering or after solder dipping if the oxygen concentration in the atmosphere surrounding the solder is 100 ppm, or below.

The method of the present invention comprises conducting joining/coating operations in an oxidizing atmosphere having a limited and controlled oxidation capability. The desired oxidation capability of the atmosphere in the immediate space surrounding the joining-/coating operation depends on the type of joining/coating being carried out. However, in all cases it is important that the atmosphere have sufficient oxidation capability to form a limited number of compounds comprising metal comprising filler or metal comprising coating elements, thus reducing the surface tension of the metal-comprising filler/coating material and preventing such materials from pulling into droplets instead of wetting the substrate surface as desired. Simultaneously, if the oxidation capability is too great, large amounts of compounds comprising metal comprising filler/coating material elements, such as metal oxides (dross), will be formed, and the presence of large amounts of such compounds can interfere with wetting of the substrate surface as well as provide a metal-comprising filler/coating material composition and joined/coated structures which do not function as desired.

Two commonly used soldering techniques, and examples of application of the method of the present invention to each technique are presented below. These examples enable one skilled in the art to practice the method, and to extend the concept of the method to similar applications.

EXAMPLE 1: Reflow Soldering

Reflow soldering is a process used to melt electroplated solder layers and/or solder paste on printed circuit boards, and to attach electrical components to the boards. The solders used are often alloys, such as an alloy of approximately 60 wt.% tin and 40 wt.% lead, with possibly small additions of antimony and/or silver. Examples of other solders used in reflow include alloys of tin, lead, gold, silicon, indium and bismuth in a wide range of relative percentages. Reflow soldering is typically done in air at a temperature between about 200° C. and about 250° C.; however, reflow soldering has been done over a temperature range from about 150° C. to about 500° C. Mild acid fluxes are commonly used to dissolve existing oxides off of the solder and substrate surfaces. A commonly used, mildly active flux is rosin or RMA flux; this is a blend of alcohol, abietic acid (rosin), and an activator, such as dimethylamine hydrochloride (DMA HCL). The substrate to which conductive leads are to be soldered typically comprises copper, gold, silver, nickel, or Kovar. Kovar is an alloy comprising nickel and iron which is available from Carpenter Technology Corporation of Reading, Pa. The circuit boards are commonly comprised of epoxy-glass laminates or sintered alumina substrates.

Reflow soldering has been and is presently done both in air and in atmospheres which are low in oxygen concentration. In the past it has been thought that removal of oxygen in the atmosphere to the lowest concentration practical was desired, because absence of oxygen in the atmosphere surrounding the soldering operation offered the benefit of less discoloration of the circuit boards, less flux degradation, resulted in easier cleaning of the circuit board after soldering, and provided better wetting of the substrates by the solder. We have discovered that use of atmospheres having too low an oxygen concentration, 100 ppm or less, has a deleterious effect on reflow soldering. Soldering in an atmosphere having an oxidation capability less than that provided by about 100 ppm of oxygen in a nitrogen comprising base composition causes the solder to "dewet" from the substrate.

Figure 1B:
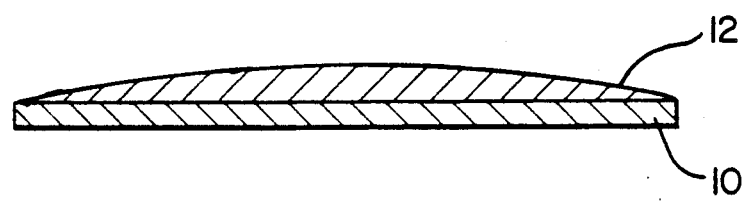
Figure 1C:
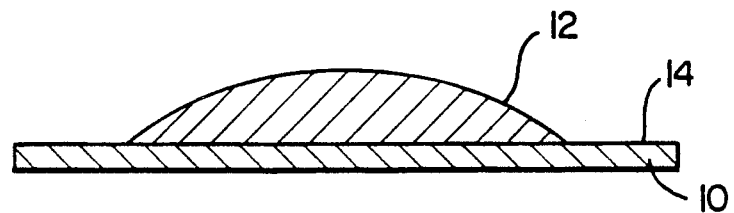

For example, FIG. 1A shows a cross-sectional sketch of a substrate 10, the upper surface of which has an electroplated layer of solder 12 thereon. FIG. 1B shows a cross-sectional sketch of the FIG. 1A structure after reflow in an atmosphere comprising more than 100 ppm of oxygen. Recommended upper oxygen concentration limits are process and application dependant and specific examples are discussed later herein. FIG. 1C shows a cross sectional sketch of the FIG. 1A structure after reflow in an atmosphere comprising less than 100ppm of oxygen, wherein the solder dewets from the surface 14 of substrate 10, leaving the substrate exposed.

Experiments were conducted to determine the range of oxygen concentrations in a nitrogen-based atmosphere which would be high enough to prevent dewetting, but low enough to prevent discoloration of the circuit boards and to prevent the formation of white haze. Some discoloration of the circuit boards is tolerated in the industry, although presence of discoloration may raise concerns that the board has been damaged in some manner. White haze refers to a residue remaining on the circuit board following soldering and subsequent cleaning of the soldered board. The white haze is believed to be a compound formed by a reaction between the tin component of commonly used solders and components present in the flux. White haze is not significantly conductive, but does provide a source of capacitance which can lead to a short under high frequency operational conditions. In addition, many coatings used in the electronics industry to protect the finalized circuit board will not adhere to the white haze compound. Thus, it is highly desirable to have a circuit board which is free from white haze.

Circuit boards comprising epoxy-glass laminate material were initially electroplated with a 60:40 tin lead solder on top of copper circuitry. The boards were coated with RMA flux and heated in an oven to a maximum temperature between 220° C. and 240° C. The total time for heating and cooling of the boards was about 5 minutes. The atmosphere comprised dry nitrogen (typically containing less than 10 ppm oxygen) with controlled additions of oxygen. Additions of water vapor and hydrogen were made to the atmosphere used in specific experiments to determine whether the presence of these common gas additives would help prevent dewetting of the solder from the substrate surface. After reflow, the flux was cleaned off the surface of the boards using Freon TMS+, a product of DuPont Company which comprises a blend of freon 113, methanol and stabilizers. The reflowed circuit boards were examined visually for dewetting, discoloration and white haze after cleaning. The results are summarized in TABLE 1, below.

TABLE 1

EFFECT OF REFLOW SOLDERING ATMOSPHERE OXYGEN CONCENTRATION ON SOLDER DEWETTING, BOARD DISCOLORATION, AND WHITE HAZE

| ATMOSPHERE | ppm $O_2$ | DE-WETTING | DIS-COLOR | WHITE HAZE |
| --- | --- | --- | --- | --- |
| nitrogen | 100 ppm or less | yes | no | no |
| nitrogen | 1,000 | no | no | no |
| nitrogen | 2,500 | no | no | no |
| nitrogen | 6,000 | no | no | no |
| nitrogen | 30,000 | no | no | no |
| nitrogen | 50,000 | no | yes | no data |
| air | 210,000 | no | yes | yes |
| nitrogen with 2.5% water vapor | 100 ppm or less | yes | no | no |
| nitrogen with 5.0% hydrogen | 100 ppm or less | yes | no | no |

To reflow solder using the system described above without dewetting, discoloration and white haze, the atmosphere oxygen concentration should be greater than about 100 ppm and less than about 50,000 ppm (5% by volume). The preferred oxygen concentration is estimated to be between about 500 ppm and 10,000 ppm. The presence of water or hydrogen did not prevent dewetting when the oxygen concentration was 100 ppm or less.

Controlled atmosphere oxygen concentrations should be beneficial for processes in general where a thin coating of molten metal is put upon a metal substrate, since presence of the controlled oxygen concentration reduces metal oxidation from that which would occur in atmospheres such as air, without causing the molten metal to dewet from the substrate surface, as can occur when the atmosphere oxygen concentration is about 100 ppm or less. It is believed controlled atmosphere oxygen concentrations would be advantageous in fluxless soldering/coating applications also. The controlled oxygen concentrations preferred in fluxless applications have not yet been determined, but will be lower than when a flux is used. In addition, the allowable variability in oxygen concentration of the atmosphere will be less for fluxless applications.

EXAMPLE 2: Wave Soldering

Wave soldering is another soldering process which has been investigated for the effect of oxygen concentration. Wave soldering is a process whereby electronic components are attached to a circuit board by bringing both the component and the board in contact with a solder bath or wave. Typically the component to be soldered to the board is placed at the desired position on the board and the assembly is contacted with the solder bath. The component is held in position on the board by methods such as putting connectors of the component through holes in the board or using a glue to attach the connectors to the board. The solder bath or wave wets the connecting points between the component and the board attachment location, forming a permanent joint. The solder bath frequently is pumped to form a standing wave. If the solder is not pumped, then the process is referred to as drag soldering. Wave soldering is also used to join non electronic components, such as automotive radiator assemblies. The method of the present invention can be applied to metal joining processes of the type described above and can be extended to other applications by one skilled in the art.

U.S. Pat. No. 4,610,391 to the present inventor disclosed that there are both advantages and disadvantages to wave soldering in a low oxygen-containing atmosphere. One advantage is there is a lower production rate of dross in atmospheres comprising a low oxygen concentration. Dross is a mixture of solder oxide and solder which is typically continually removed from the solder bath and replaced with pure solder, increasing the cost of soldering. One disadvantage of low oxygen concentrations is that they cause an increase in bridging. Bridging is the unintended joining of adjacent component leads by solder. Bridging can result in shorting out of the circuit. U.S. Pat. No. 4,610,391 describes a process for wave soldering a work piece wherein a portion of the wave is in contact with an atmosphere containing one percent or less oxygen by volume, while a different portion of the wave is in contact with an atmosphere containing from about 18 percent to about 50 percent by volume oxygen. It was discovered upon subsequent experimentation that there are atmosphere oxygen concentrations for which the dross production rate of the wave could be reduced without causing high bridging rates. This discovery permits use of a single atmosphere in contact with the entire soldering wave, thus providing an improvement over the previously described, patented method.

Circuit boards comprising epoxy-glass laminate material having through hole components and 120 potential locations for bridge formation per board were soldered in an Electrovert Econpak conveyorized soldering machine (of the type available from Electrovert Ltd., Montreal Canada). An RMA flux was used. The boards were preheated to about 100° C. The solder wave temperature was about 250° C. The solder alloy was 62:36:2 by weight ratio of tin:lead:antimony. The results for bridging rate and dross production are summarized in TABLE 2 below.

TABLE 2

EFFECTS OF WAVE SOLDERING ATMOSPHERE OXYGEN CONCENTRATION ON BRIDGING RATE AND DROSS PRODUCTION
The soldering atmosphere was comprised of dry nitrogen containing the oxygen concentrations presented below.

| ppm $O_2$ | BRIDGES PER BOARD | DROSS PRODUCTION IN LBS/HR |
|---|---|---|
| 200,000 | 1 | 0.41 |
| 100,000 | 2 | no data |
| 50,000 | 0 | 0.30 |
| 20,000 | 0 | 0.19 |
| 10,000 | 1 | 0.13 |
| 5,000 | 7 | 0.09 |
| 2,000 | 6 | 0.06 |

The bridges per board ranged between 0 and 2 for oxygen levels above one percent (10,000 ppm). These data are considered to be equivalent. However, at lower oxygen concentrations, the bridges per board increased sharply to 6 to 7 per board. The dross formation rate decreased steadily from 0.41 lbs/hr at 200,000 ppm (20% by volume) oxygen concentration to 0.06 lbs/hr at 2,000 ppm. The preferred oxygen concentration is, therefore, between about 10,000 ppm and 20,000 ppm for this particular soldering application; this oxygen concentration provides about a 50% reduction in dross formation rate without increased bridging.

The optimum oxygen concentration for wave soldering will vary for different board designs and flux types. Minor experimentation can be done to determine the optimum levels. It is expected, in view of the present discovery that for most boards and fluxes, the optimum oxygen concentration will be between about 1,000 ppm and about 100,000 ppm. When no flux is used, the optimum oxygen concentrations may be substantially lower.

The oxidizing capability of the joining/coating process atmosphere can be controlled to the desired set point by numerous techniques which would be apparent to one skilled in the art. One of the more common techniques is to control the composition of a gas which passes through the processing area, providing the desired atmosphere surrounding the joining/coating operation.

As previously discussed, the most preferred inert gas for use in combination with oxygen at the specified concentrations is nitrogen due to its cost and non toxicity. Cryogenic nitrogen, supplied via vaporization of liquid nitrogen, typically has an oxygen concentration of less than 10 ppm oxygen. Other forms of nitrogen which are commercially available include pressure swing absorption generated nitrogen and membrane generated nitrogen. The oxygen contents of these forms of ntrogen range from about 1,000 to about 50,000 ppm oxygen. These latter two sources of nitrogen can be much less expensive than cryogenic nitrogen. If the available nitrogen source does not provide the desired oxygen concentration, it can be adjusted in a manner which will provide the desired oxygen concentration by adding either nitrogen, oxygen, or air to the available nitrogen source.

Examples of additional metal application processes which would benefit from use of a processing atmosphere of controlled oxidation capability include hot air leveling, which is used to coat circuit boards with solder, zinc galvanizing, and tin coating of steel.

The above disclosure illustrates typical embodiments which demonstrate the method of the present invention. The best mode of the invention as presently contemplated is disclosed. However, one skilled in the art will recognize the broad range of applicability of the generic concept of the invention. It is intended that variations on the disclosed embodiment which fall within the spirit and scope of the invention be included as part of the invention, as expressed in the appended claims.

I claim:

1. A method of applying a metal-comprising coating to a substrate area on a circuit board, which method provides good wetting of said substrate area by said coating and a low rate of bridging of adjacent substrate areas, said method comprising:
    (a) providing a bath of metal-comprising coating material, wherein said coating material is provided at a temperature at which it is sufficiently fluid to permit application of a coating of the desired thickness under the process conditions;
    (b) providing at least one substrate area to which said metal-comprising coating material is to be applied, wherein the surface of said substrate area can be wetted by said coating material; and
    (c) contacting said metal-comprising coating material with said at least one substrate area in a single, controlled oxidizing atmosphere having an oxygen concentration of from about 10 ppm to about 100,000 ppm.

2. A method of applying a metal-comprising coating to a substrate area on a circuit board which method provides good wetting of said substrate area by said coating and reduced discoloration and white haze on said circuit board, said method comprising:
    (a) providing an assembly comprising a metal-comprising coating material which is in contact with at least one substrate area to which said metal-comprising coating material is to be bonded; and,
    (b) heating said assembly to a temperature at which said metal-comprising coating material is sufficiently fluid and active to bond to said substrate area, wherein said heating is carried out in a single, controlled oxidizing atmosphere having an oxygen concentration of from about 10 ppm to about 100,000 ppm.

3. The method of claim 1 or claim 2 wherein said oxygen concentration is controlled at a set point.

4. The method of claim 1 or 2 wherein a flux is present at the time of contacting said metal-comprising coating material with said substrate.

5. The method of claim 3 wherein said oxygen concentration is controlled at least within ±30 percent of said set point.

6. The method of claim 4 wherein said oxygen concentration is controlled at a set point at least within ±30 percent of said set point.

7. The method of claim 1 or 2 wherein the metal portion of said metal-comprising coating is selected from a group consisting of tin, lead, antimony, silicon, bismuth, silver, gold, and alloys thereof.

8. The method of claim 1 or claim 2 wherein said single, controlled oxidizing atmosphere comprises an inert gas and oxygen.

9. The method of claim 8 wherein said inert gas is selected from the group consisting of nitrogen, argon, hydrogen, helium, water vapor, carbon dioxide and mixtures thereof.

10. A method of joining a first metal-comprising surface to a second metal-comprising surface in a circuit board, which method provides good wetting of said metal-comprising surfaces by a metal-comprising filler material used to join said metal-comprising surfaces, reduced discoloration and reduced white haze on said circuit board, said method comprising:
    (a) providing a bath of metal-comprising filler material, wherein said filler material is provided at a temperature at which it is sufficiently fluid and active to bond to said metal-comprising surfaces under the process conditions;
    (b) providing said metal-comprising surfaces to be joined, wherein said surfaces to be joined are at a temperature which permits adequate bonding of said filler material under said process conditions and wherein said surfaces can be wetted by said filler material; and
    (c) contacting said metal-comprising surfaces to be joined with said metal-comprising filler material in a single, controlled oxidizing atmosphere having an oxygen concentration of from about 10 ppm to about 100,000 ppm.

11. A method of joining a first metal comprising surface to a second metal-comprising surface in a circuit board which method provides good wetting of said metal-comprising surfaces by a metal comprising filler material used to join said metal-comprising surfaces, reduced discoloration and reduced white haze on said circuit board, said method comprising:
    (a) providing an assembly comprising said metal-comprising surfaces to be joined wherein said metal-comprising surfaces are in contact with said metal-comprising filler material; and,
    (b) heating said assembly to a temperature at which said metal-comprising filler material is sufficiently fluid and active to join said metal-comprising surfaces, wherein said heating is carried out in a single, controlled oxidizing atmosphere having an oxygen concentration of from about 7,000 ppm to about 100,000 ppm.

12. The method of claim 10 or claim 11 wherein the melting temperature of said metal-comprising filler material is less than the melting temperature of said at least two metal-comprising surfaces.

13. The method of claim 10 or claim 11, wherein a flux is added to said metal-comprising filler material or a flux is applied to at least one of said metal-comprising surfaces.

14. The method of claim 10 or claim 11 wherein said oxygen concentration is controlled at a setpoint at least within ±30 percent of said setpoint.

15. The method of claim 10 or claim 11 wherein said single, controlled oxidizing atmosphere comprises an inert gas and oxygen.

16. The method of claim 15 wherein said inert gas is selected from the group consisting of nitrogen, argon, hydrogen, helium, water vapor, carbon dioxide, and mixtures thereof.

17. The method of claim 11 wherein said atmosphere comprises oxygen and an inert gas selected from the group consisting of nitrogen, argon, hydrogen, helium, water vapor, carbon dioxide, and mixtures thereof.

18. The method of claim 10 wherein said filler material is supplied as a bath and said joining method is a bath soldering technique wherein a low rate of dross formation and a low rate of bridging occur, said method further comprising:
    (d) separating in said atmosphere from said bath said at least two metal-comprising surfaces to be joined along with sufficient filler material for joining.

19. The method of claim 18 wherein said oxygen concentration is controlled from about 10 to about 20,000 ppm.

20. The method of claim 11 wherein said contacting atmosphere comprises an inert gas and oxygen and wherein said oxygen concentration is controlled to a setpoint within a variation of ±30 percent or less.

21. The method of claim 20 wherein said joining operation is a reflow soldering technique, and wherein said setpoint range corresponds with an oxygen concentration range from greater than about 7000 ppm to less than about 50,000 ppm.

22. The method of claim 21 wherein said setpoint range corresponds with an oxygen concentration range from greater than about 7000 ppm to about 10,000 ppm.

23. The method of claim 1 wherein the coating material is supplied at a temperature of less than about 250° C.

24. The method of claim 21 wherein a flux is added to said metal-comprising filler material or a flux is applied to at least one of said metal-comprising surfaces.

25. The method of claim 22 wherein a flux is added to said metal-comprising filler material or a flux is applied to at least one of said metal-comprising surfaces.

26. The method of claim 18 or claim 19 wherein said oxygen concentration is controlled at a setpoint.

27. The method of claim 18 or claim 19 wherein a flux is present at the time of contacting said metal-comprising filler material with said metal comprising surfaces to be joined.

* * * * *